(12) United States Patent
Park et al.

(10) Patent No.: US 11,559,913 B2
(45) Date of Patent: Jan. 24, 2023

(54) RAZOR BLADE AND MANUFACTURING METHOD THEREOF

(71) Applicant: DORCO CO., LTD., Seoul (KR)

(72) Inventors: Min Joo Park, Gyeonggido (KR);
Sung Hoon Oh, Gyeonggido (KR);
Seong Won Jeong, Gyeonggido (KR)

(73) Assignee: DORCO CO., LTD., Seoul (KR)

( * ) Notice: Subject to any disclaimer, the term of this patent is extended or adjusted under 35 U.S.C. 154(b) by 294 days.

(21) Appl. No.: 16/880,901

(22) Filed: May 21, 2020

(65) Prior Publication Data

US 2020/0368929 A1 Nov. 26, 2020

(30) Foreign Application Priority Data

May 22, 2019 (KR) .................. 10-2019-0060078

(51) Int. Cl.
*B26B 21/60* (2006.01)
*B26B 21/40* (2006.01)
*C23C 14/06* (2006.01)
*C23C 14/34* (2006.01)

(52) U.S. Cl.
CPC .......... *B26B 21/60* (2013.01); *B26B 21/4068* (2013.01); *C23C 14/067* (2013.01); *C23C 14/34* (2013.01)

(58) Field of Classification Search
CPC ... B26B 21/60; B26B 21/4068; C23C 14/067; C23C 14/34
See application file for complete search history.

(56) References Cited

U.S. PATENT DOCUMENTS

| 3,622,402 | A | | 11/1971 | Baranow et al. |
| 3,712,798 | A | | 1/1973 | Van Thyne et al. |
| 3,960,608 | A | | 6/1976 | Cole |
| RE30,106 | E | † | 10/1979 | Polk et al. |
| 4,556,607 | A | | 12/1985 | Sastri |
| 5,630,275 | A | | 5/1997 | Wexler |

(Continued)

FOREIGN PATENT DOCUMENTS

| EP | 579756 | 7/1998 |
| EP | 2682498 | 1/2014 |

(Continued)

OTHER PUBLICATIONS

European Patent Office Application Serial No. 20175765.5, Search Report dated Sep. 24, 2020, 9 pages.

(Continued)

*Primary Examiner* — Omar Flores Sanchez
(74) *Attorney, Agent, or Firm* — Lee, Hong, Degerman, Kang & Waimey PC (57) ABSTRACT

The present disclosure provides an improvement to razor blade coating by a physical vapor deposition method, by forming a hard coating layer as a thin coating layer in which chromium boride, which is a nanocrystalline structure having high hardness, is dispersed in an amorphous mixture of chromium and boron, thereby improving the strength and hardness of the thin coating layer and securing the bonding force by chromium in the amorphous mixture between the hard coating layer and a blade substrate on which an edge of the razor blade is formed.

16 Claims, 6 Drawing Sheets

(56) References Cited

U.S. PATENT DOCUMENTS

| | | | |
|---|---|---|---|
| 5,687,485 | A | 11/1997 | Shurtleff et al. |
| 5,761,814 | A | 6/1998 | Anderson et al. |
| 5,956,848 | A | 9/1999 | Tseng et al. |
| 5,956,851 | A | 9/1999 | Apprille et al. |
| 6,041,926 | A | 3/2000 | Petricca et al. |
| 6,052,903 | A | 4/2000 | Metcalf et al. |
| 6,185,822 | B1 | 2/2001 | Tseng et al. |
| 6,212,777 | B1 | 4/2001 | Gilder et al. |
| 6,442,839 | B1 | 9/2002 | Tseng et al. |
| 6,516,518 | B1 | 2/2003 | Garraway et al. |
| 6,612,040 | B2 | 9/2003 | Gilder |
| 6,684,513 | B1 | 2/2004 | Clipstone et al. |
| 6,763,593 | B2 | 7/2004 | Nakatsu et al. |
| 7,510,760 | B2 * | 3/2009 | Malshe ............ C23C 24/00 428/408 |
| 7,799,420 | B2 | 9/2010 | Beck et al. |
| 7,939,172 | B2 | 5/2011 | Gorokhovsky et al. |
| 9,290,847 | B2 | 3/2016 | Wu et al. |
| 10,287,670 | B2 † | 5/2019 | Gorokhovsky |
| 2005/0011748 | A1 | 1/2005 | Beck et al. |
| 2006/0199013 | A1 * | 9/2006 | Malshe ............ C23C 30/005 428/408 |
| 2006/0277767 | A1 | 12/2006 | Sun et al. |
| 2013/0334033 | A1 † | 12/2013 | Jeong et al. |
| 2017/0136641 | A1 † | 5/2017 | Siozios et al. |
| 2018/0274080 | A1 | 9/2018 | Li et al. |
| 2020/0023533 | A1 | 1/2020 | Logothetidis et al. |
| 2020/0368929 | A1 * | 11/2020 | Park ............ C23C 14/028 |

FOREIGN PATENT DOCUMENTS

| | | |
|---|---|---|
| JP | 2002294409 | 10/2002 |
| JP | 2012110998 | 6/2012 |
| KR | 10-2011-0027745 | 3/2011 |
| KR | 101101742 | 1/2012 |
| KR | 10-2017-0038055 | 4/2017 |
| WO | 2010081118 | 7/2010 |
| WO | 2016015771 | 2/2016 |
| WO | 2018184723 | 10/2018 |

OTHER PUBLICATIONS

Korean Intellectual Property Office Application No. 10-2019-0060078, Office Action dated Nov. 3, 2020, 5 pages.

Korean Intellectual Property Office Application No. 10-2019-0060078, Notice of Allowance dated Jan. 20, 2021, 2 pages.

Zhou, M. et al., "New Cr-B hard coatings by r.f.-plasma assisted magnetron sputtering method," Thin Solid Films 343-344: 234-237, Apr. 1999, 4 pages.

Kvashnin, A. et al., "Computational Search for Novel Hard Chromium-Based Materials", The Journal of Physical Chemistry Letters, 8(4), 755-764, Jan. 2017, 28 pages.

\* cited by examiner

† cited by third party

RAZOR BLADE AND MANUFACTURING METHOD THEREOF

CROSS-REFERENCE TO RELATED APPLICATIONS

Pursuant to 35 U.S.C. § 119(a), this application claims the benefit of earlier filing date and right of priority to Korean Patent Application Number 10-2019-0060078, filed May 22, 2019, the contents of which are hereby incorporated by reference herein in its entirety.

TECHNICAL FIELD

The present disclosure relates to a razor blade and a method for manufacturing a razor blade. More particularly, the present disclosure relates to a razor blade edge for a razor, having a hard coating layer for improving durability and hardness and a method for manufacturing the razor blade edge.

BACKGROUND

The statements in this section merely provide background information related to the present disclosure and do not necessarily constitute prior art.

Razor blades of wet razor are usually made from a base material or substrate of stainless steel that goes through heat treatment to increase the hardness, the heat treated substrate subsequently going through the polishing process to form blade edges. Thereafter, various coating materials are deposited over the edge of the razor blade to increase the strength and durability of the razor blade edge sharpened at one end. As a coating material, a typical metallic material for hard coating or ceramic-based carbides, nitrides, oxides, metal borides, and the like may be used. In addition, organic materials such as PolyTetraFlouroEthylene (PTFE) may be deposited on the hard thin-film material to reduce friction with the skin during shaving and to improve shaving performance.

In general, as hardness of the coating thin-film increases, brittleness also increases, thus possibly deteriorating the durability of the film. In this case, an intermediate layer is formed of a material such as molybdenum between the hard thin film and the blade substrate to improve the adhesion to the substrate and to complement the brittleness of the hard thin film.

Meanwhile, it has been a general practice to perform deposition of dissimilar materials by arranging two or more sputter targets around a razor blade under different voltage and bias conditions controlled for each target, thereby depositing the target materials on the razor blade exposed to the targets. To counteract the need for a larger deposition chamber and a longer time for deposition, a method has been proposed to perform deposition under a single sputtering condition with a single sputter target in which dissimilar materials are mechanically bonded together.

SUMMARY

According to some embodiments, the present disclosure provides a razor blade including a blade substrate on which a blade edge is formed, a hard coating layer coated on the blade substrate, and a polymer coating. The hard coating layer includes an amorphous region in which chromium and boron are mixed, and one or more nanocrystalline structures are dispersed in the amorphous region. The polymer coating is formed on the hard coating layer.

The nanocrystalline structure may be chromium boride.

The hard coating layer may be a single layer.

The nanocrystalline structure may have a particle diameter in a range of 3 to 100 nm.

The hard coating layer may have a thickness in a range of 10 to 1000 nm.

The razor blade may further include an adhesion-enhancing layer disposed between the hard coating layer and the blade substrate.

The adhesion-enhancing layer has a content of Cr at 90 atomic percent (at %) or more.

The nanocrystalline structures included in the hard coating layer may have a volume ratio of 30% or more.

The hard coating layer may be configured to have the nanocrystalline structures at a ratio that varies gradually from the inner side to the outer side of the hard coating layer that is in contact with the blade substrate.

In accordance with another embodiment, the present disclosure provides a method for manufacturing a razor blade, the method including performing a heat treatment on a blade substrate and forming a blade edge by polishing a heat-treated blade substrate and forming a hard coating layer by performing physical vapor deposition (PVD) on the heat-treated blade substrate, on which the blade edge is formed, by using a single composite target, in which chromium and boron are mechanically combined and mixed, to provide the hard coating layer in the form of nanocrystalline structures dispersed in an amorphous region in which the chromium and the boron are mixed, and forming a polymer coating on the hard coating layer.

The hard coating layer may be a single layer.

The nanocrystalline structure may have a particle diameter in a range of 3 to 100 nm.

The physical vapor deposition that forms the hard coating layer may be performed for sputtering by a collision cascade process under a sputtering condition that the blade substrate has a bias in a range of of −50 to −750 V, a temperature in a range of 0 to 200° C., and a DC power density in a range of 1 to 12 W/cm$^2$.

The physical vapor deposition that forms the hard coating layer may be performed for sputtering by a collision cascade process under a sputtering condition that the blade substrate has a bias in a range of −200 to −600 V, a temperature in a range of 100 to 150° C., and a DC power density in a range of 4 to 8 W/cm$^2$.

The single composite target may further include a material in which the chromium and the boron are crystallographically combined.

The hard coating layer may be configured to have the nanocrystalline structures of chromium boride at a volume ratio that is changed in a thickness direction by adjusting an area ratio of the chromium to the boron in the single composite target in a direction in which the blade substrate moves through a deposition with respect to the single composite target.

DETAILED DESCRIPTION

The present disclosure seeks to provide a razor blade coating with a hard coating layer as a thin coating layer in which chromium boride, which is a nanocrystalline structure having high hardness, is dispersed in an amorphous mixture of chromium and boron, thereby improving the hardness and strength, i.e., the durability of the thin coating layer.

Exemplary embodiments of the present disclosure are described below with reference to the accompanying drawings. In the following description, like reference numerals would rather designate like elements, although the elements are shown in different drawings. Further, in the following description of the at least one embodiment, a detailed description of known functions and configurations incorporated herein will be omitted for the purpose of clarity and for brevity.

Additionally, various terms such as first, second, A, B, (a), (b), etc., are used solely for the purpose of differentiating one component from the other but not to imply or suggest the substances, the order or sequence of the components. Throughout this specification, when a part "includes" or "comprises" a component, the part is meant to further include other components, not excluding thereof unless there is a particular description contrary thereto. In addition, the terms such as "unit", "module", and the like refer to units for processing at least one function or operation, which may be implemented by hardware, software, or a combination thereof. Further, the description that the composition ratio of A to B is large or small means that the value of A/B is large or small.

According to at least one embodiment of the present disclosure, physical vapor deposition (PVD) is used for coating a hard coating layer 120. The physical vapor deposition may be any one of methods including a Direct Current (DC) sputtering, DC magnetron sputtering, DC unbalanced magnetron sputtering, pulse DC unbalanced magnetron sputtering, radio frequency (RF) sputtering, arc ion plating, electron-beam evaporation, ion-beam deposition, or ion-beam assisted deposition.

Figure 1:
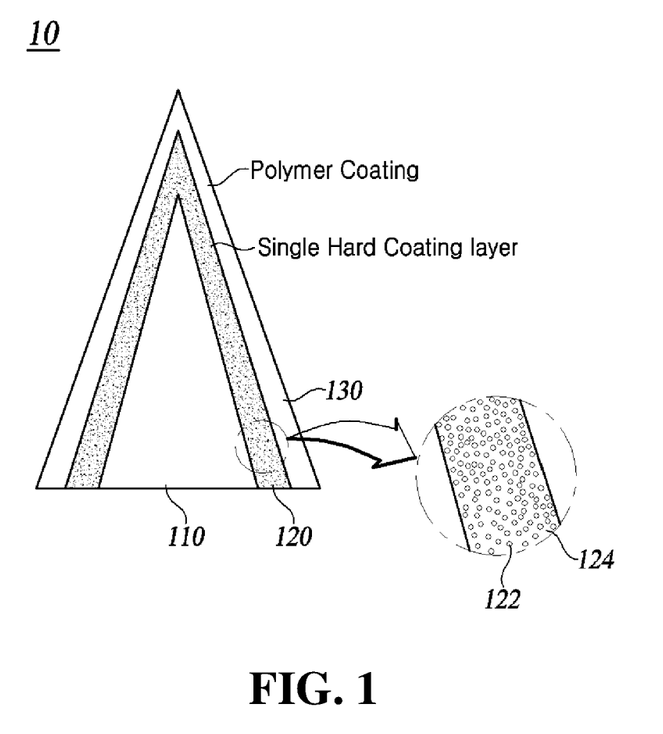
FIG. 1 is a partial cross-sectional view of a blade edge for a razor and coating layers on the blade edge, according to at least one embodiment of the present disclosure.

FIG. 1 is a partial cross-sectional view of a blade edge for a razor and coating layers on the blade edge, according to at least one embodiment of the present disclosure.

As shown in FIG. 1, a razor blade 10 according to at least one embodiment of the present disclosure includes a razor blade substrate 110, a hard thin film layer or hard coating layer 120, and a polymer coating 130.

In at least one embodiment, the hard coating layer 120 is a single layer containing chromium (Cr) and boron (B) on the blade substrate 110. Here, the term 'single-layer' means that the distinction between regions within the single layer is indefinite. Further, the single-layer may also encompass a layer configured to have different composition ratios depending on the position in the thickness direction thereof. The single-layer may be superior in durability compared to the multi-layer thin film. An initial fracture generally starting at the interlayer boundary under repeated impact loads is the main cause of reduced durability, and thus, the single-layer may outlast the multi-layer thin film.

In particular, the hard coating layer 120, according to at least one embodiment, is formed such that nanocrystallines 122 of high-hardness chromium borides is dispersed in amorphous 124.

Figure 2:
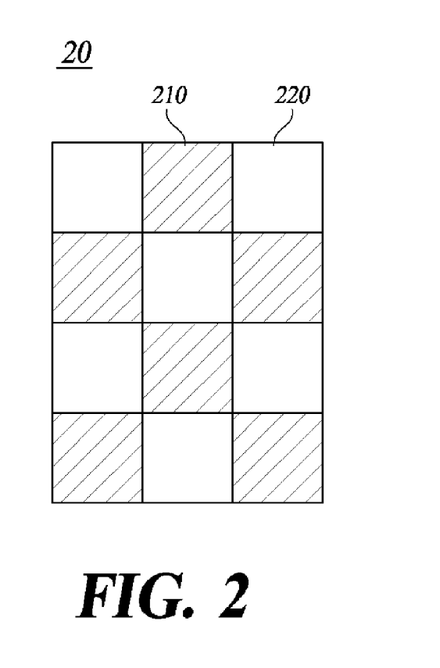
FIG. 2 is a conceptual diagram of a first type of single composite target according to at least one embodiment of the present disclosure.

FIG. 2 is a conceptual diagram of a first type of single composite target according to at least one embodiment of the present disclosure.

As shown in FIG. 2, a sputtering target used for physical vapor deposition is configured to have combined multiple regions composed of dissimilar materials. A single composite target 20 is a combination of dissimilar materials including at least one first material 210 and at least one second material 220 alternately arranged in a mosaic form, to be used as a single target. The deposition ratio of the first material 210 to the second material 220 on the substrate 110 may be controlled by adjusting the area ratio in the single composite target 20 between the first material 210 and the second material 220.

According to at least one embodiment of the present disclosure, the first material 210 used in the single composite target 20 of the first type is chrome (Cr) and the second material 220 used therein is boron (B).

Figure 3:
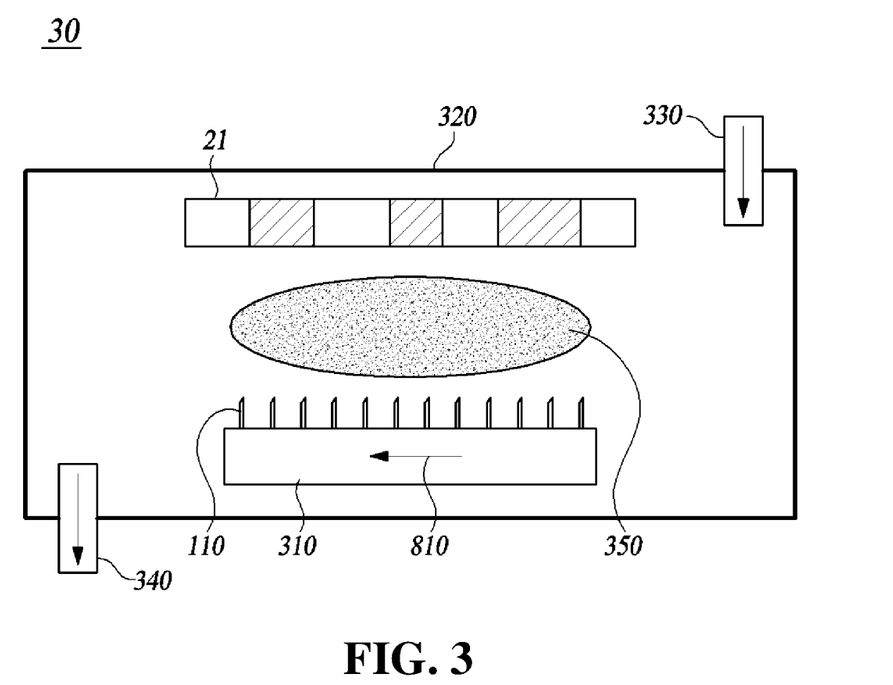
FIG. 3 is a conceptual diagram of a configuration of a vacuum chamber for depositing a hard coating layer according to at least one embodiment of the present disclosure.

FIG. 3 is a conceptual diagram of a configuration of a vacuum chamber for depositing a hard coating layer according to at least one embodiment of the present disclosure.

As shown in FIG. 3, a sputtering apparatus 30 includes an aggregate 310 and a vacuum chamber 320 enclosing the aggregate 310 of multiple arranged elements of sputtering targets that are multiples of the single target 20 and razor blade substrates 110 to be coated. The sputtering apparatus 30 is internally formed with a high vacuum of about $10^{-6}$ torr, an atmosphere by an injection gas (in at least one embodiment, argon or Ar gas), and a plasma 350. With argon gas injected and direct current (DC) power applied, argon gas is plasma-excited, and argon ions are generated. The generated argon ions are accelerated toward the single composite target 20 by a DC power condition at the negative electrode as applied to the target side, until they collide with the target surface, causing neutral target atoms to be drawn out.

The razor blade substrates 110 are formed by using a material such as stainless steel, undergo a heat treatment process to increase the hardness, and are polished to form a razor blade edge, and then simultaneously deposited with particles of dissimilar materials discharged from the single composite target 20 as shown in FIG. 2 to form the hard coating layer 120.

The razor blade substrate 110 may be subjected to a surface cleaning treatment with argon plasma before the deposition to remove residual foreign matter and oxide films. In addition, before performing a series of deposition operations on the blade aggregate 310 and before it is transported to face the single composite target 20, the blade aggregate 310 may undergo pre-sputtering in the argon atmosphere for about 5 to 20 seconds for cleaning the single composite target 20.

Of the blade aggregate 310, the blade areas to be coated and the sputtering target may be disposed to face each other. The instant embodiment illustrates a case where the blade aggregate 310 is transferred with respect to a fixed sputtering target, although the reverse is also envisioned. The razor blade aggregate 310 and/or the single composite target 20 may include a bias voltage forming mechanism (not shown in drawings) and/or a heating mechanism (not shown in drawings) required for sputtering.

According to at least one embodiment of the present disclosure, the single composite target 20 includes Cr and B and deposition is performed with an atomic ratio of Cr to B, ranging from 9:1 to 4:6. Preferably, the atomic ratio of Cr to B may be 6:4.

In this case, the power density for deposition may be in the range of 1 to 12 W/cm² and may correspond to a level of 1 to 10 kW. The blade substrate 110 may be subject to a bias of −50 to −750 V, a temperature of 0 to 200° C., and a DC power density of 1 to 12 W/cm². Preferably, the blade substrate 110 may be subject to a temperature of 15 to 75° C., a bias of −200 to −600 V, and a DC power density of 4 to 8 W/cm².

This is a sputtering condition derived by considering the characteristic sputtering ratios of Cr and B and these are formed as a single composite target 20. For reference, when Cr is incident on the substrate 110 with collisional energy of 250 to 10,000 eV and when B is incident on the same with collisional energy of 1,000 to 10,000 eV, the sputtering rate is high, based on which the single composite target 20 may be set to be within a range where they obtain collisional energy of 1,000 to 10,000 eV. When the ion energy of the particles incident on the blade substrate 110 is at a certain level, for example, 1,000 eV or less for B and 250 eV or less for Cr, or less, which corresponds to a knock-on condition, the particles may eventually bounce, and deposition may not be done well. On the contrary, collisional energy of 100,000 eV or more will not land the particles for deposition on the surface, which, instead, thrust deep into the substrate 110. The described sputtering conditions are selected in consideration of the sputtering apparatus of at least one embodiment so that the particles are accelerated with the ion energy in the medium range of both extremes, for allowing cascade sputtering to occur mostly and thus the ion beam mixing effect which improves the bonding force between the surface of the blade substrate 110 and the coating materials toward the desirable coating process.

In the above-described conditions, the hard coating layer 120 is distinctively formed to have a thickness of at least 10 nm and to be up to 1,000 nm thick. In addition, the hard coating layer 120 features the nanocrystallines 122 having a particle diameter of 3 to 100 nm as being dispersed in the amorphous 124.

In at least one embodiment, the nanocrystalline 122 may include various types of crystal structures in which Cr and B are crystallographically combined, such as CrB, $CrB_2$, $Cr_2B$, and may also include Cr crystals, while the amorphous 124 may be a mixture of Cr and B. In addition, the size of crystals formed in the hard coating layer 120 may be appropriately controlled by appropriately adjusting the collision energy of the particles that collide with the blade substrate 110.

The amorphous 124 structure, according to at least one embodiment, is arranged to surround the nanocrystalline 122 structures and thereby serves to disperse and absorb stress applied to the high-hardness nanocrystalline 122 structure in which Cr and B are crystallographically combined. In other words, the nanocrystalline 122 structures according to at least one embodiment may contribute to securing the hardness of the hard coating layer 120, and the amorphous 124 structure including Cr and B may surround and support the nanocrystalline 122 structures to disperse an impact load, thereby securing the strength and durability of the hard coating layer 120. In addition, Cr in the amorphous 124 structure may contribute to securing the adhesion between the hard coating layer 120 and the substrate stainless steel.

On the other hand, B has a weak affinity with Fe, the main component of the blade substrate 110, and it has a higher affinity with Cr than with Fe. In physical vapor deposition, B may be crystallographically bound to Cr or dispersed within the amorphous 124.

In general, when the size of the formed crystal is large, the surface hardness may be further increased, but the brittleness may increase, and durability may be deteriorated due to damage from an external impact. The sputtering conditions are preferably controlled such that crystals of appropriately small sizes, which are on the order of several to tens of nanometers in diameter, are evenly distributed. For example, when the energy of the particles incident on the deposition surface is large, it may exhibit the effect of splitting the crystal nuclei of the deposition surface or splitting the grown crystal, thereby suppressing the increase in the size of the nanocrystalline 122 structures in the hard coating layer 120.

Meanwhile, an ion gun may be additionally installed on the sputtering apparatus according to one embodiment, and a thin-film deposition process may be performed using the sputtering apparatus and the arc ion plating method together.

Figure 4:
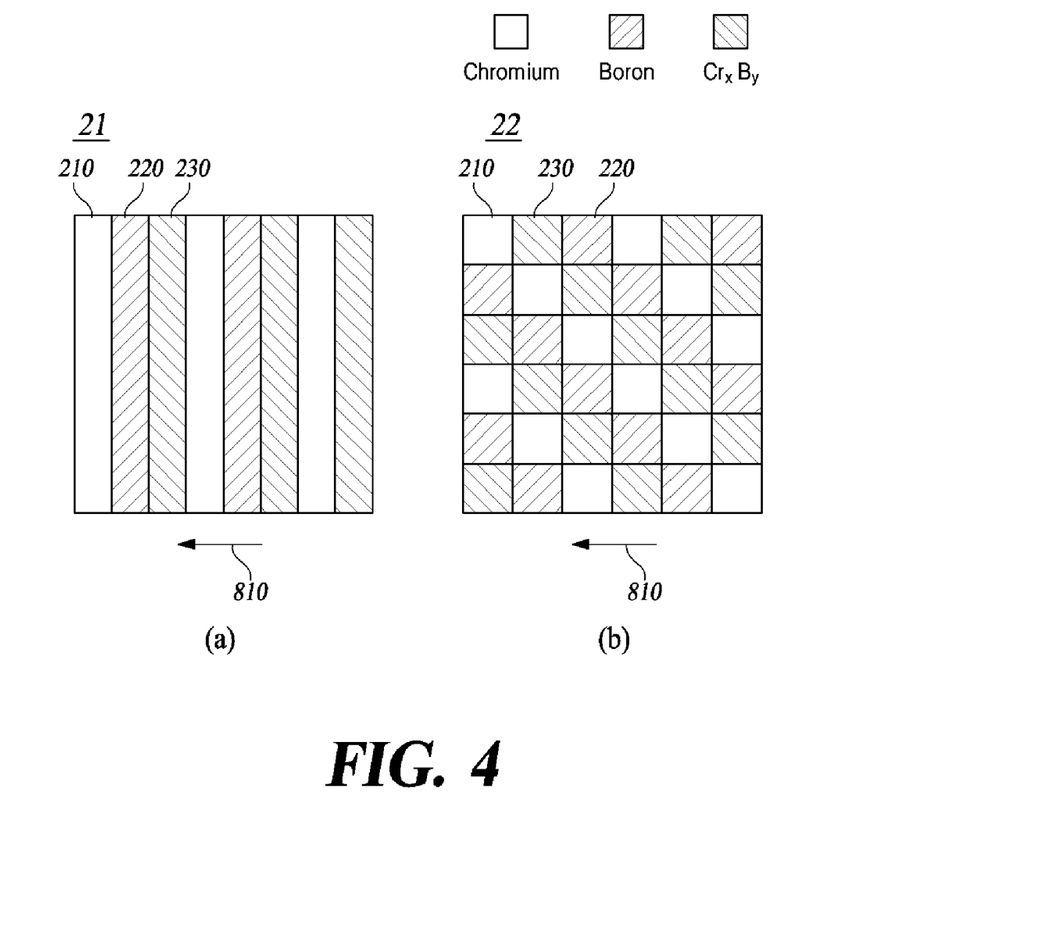
FIG. 4 is conceptual diagrams of a second type of single composite target and a third type of single composite target according to some embodiments of the present disclosure.

FIG. 4 is conceptual diagrams of a second type of single composite target and a third type of single composite target according to some embodiments of the present disclosure.

As shown in FIG. 4, the second and third types of the single composite targets 21 and 22 are each formed by three types of target materials combined. A first material 210 is Cr, a second material 220 is B, and a third material 230 is one in which materials of Cr and B are crystallographically combined in a certain arrangement. The first, second, and third materials 210, 220, and 230 arranged in the orders shown in FIG. 4 at (a) and (b) are merely illustrative but not restrictive examples, and they may be arranged in different orders or at different area ratios.

The third material 230 may be a composite of Cr and B that are crystallographically combined in the form of $Cr_xB_y$, such as CrB, $CrB_2$, $Cr_2B$, and $CrB_4$ among others, and Cr and B may be combined at various atomic ratios. When using a partial target composed of a material in which Cr and B are crystallographically combined, it is highly probable that the coating layer formed therefrom contain mainly the same partial target's crystal structures distributed therein, where a specific one of the crystal structures distributed in the coating layer may be induced to become the dominant ingredient therein.

In at least one embodiment, the metallic material of the dissimilar materials is described as being Cr, but the present disclosure is not so limited, and envisions the metallic material as being any one of Cr, Ni, Ti, W, and Nb. In at least one embodiment, Cr is selected to be the metallic material in consideration of the thin-film adhesiveness with the stainless steel of the blade substrate 110.

Although not shown, a single composite target may be configured such that the second material 220 and the third material 230 are inserted into the first material 210, wherein the area ratio between the dissimilar materials may be adjusted by adjusting the interval in the pattern at which the second and third materials are inserted or by adjusting the sizes of the pattern elements.

The single composite targets 20, 21, and 22 may be configured in any manner in terms of form and arrangement as long as the targets 20, 21, and 22 can contain properly distributed dissimilar materials until they are granulated and drawn out therefrom to be sufficiently uniformly mixed for the blade substrate 110 subject to the deposition.

The respective materials disposed inside the single composite targets may take various shapes such as circles, triangles, and squares, for example. Further, the rectangular shapes may be arranged in a mosaic pattern to be mechanically combined. Alternatively or additionally, a single material may form the entire single composite target with a plurality of holes formed therein for insertion and bonding of dissimilar materials.

Figure 5:
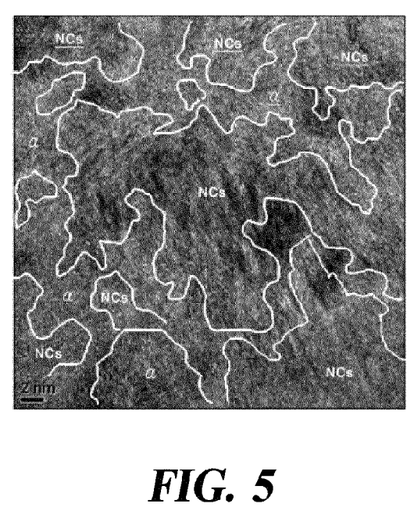
FIG. 5 is a transmission electron microscopy (TEM) photograph of a hard coating layer coated according to at least one embodiment of the present disclosure.

FIG. 5 is a transmission electron microscopy (TEM) photograph of a hard coating layer coated according to at least one embodiment of the present disclosure.

Figure 6:
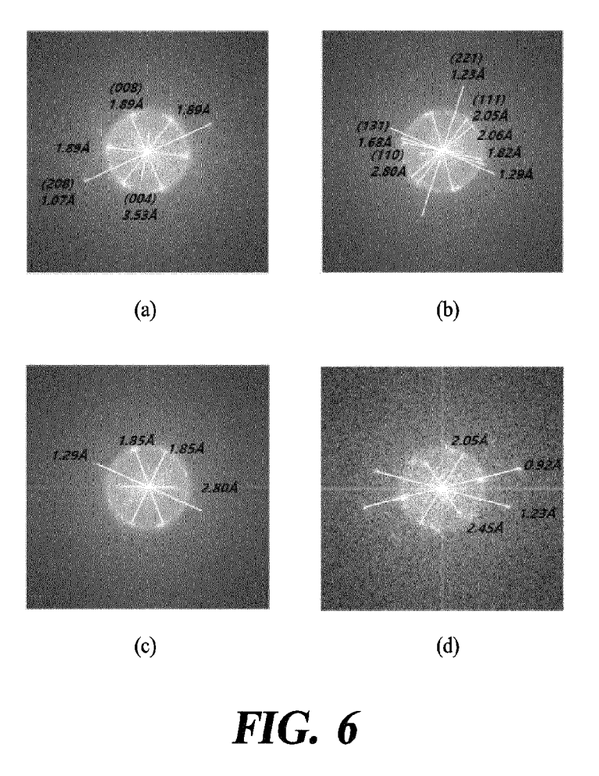
FIG. 6 shows results of selected area electron diffraction (SAED) of nanocrystallines of a hard coating layer coated according to at least one embodiment of the present disclosure.

FIG. 6 shows results of selected area electron diffraction (SAED) of nanocrystallines of a hard coating layer coated according to at least one embodiment of the present disclosure.

As shown in FIG. 6, deposition of the nanocrystallines 122 having cmcm-CrB structure and I4/mcm-CrB structure was confirmed, and according to Kvashnin et al. (Kvashnin, A. G., Oganov, A. R., Samtsevich, A. I. & Allahyari, Z. (2017). Computational search for novel hard chromium-based materials, Journal of Physical Chemistry, 8(4), 755-764) and in theory at least, all of cmcm-Cr, I41/amd and I4/mcm exhibit very high hardness in terms of hardness of crystalline particle, and the CrB crystal as produced and measured by the embodiments of the present disclosure may be interpreted as achieving a sufficiently high hardness.

On the other hand, although not shown in drawings, the hard coating layer 120 according to some embodiments of the present disclosure may have a configuration in which the average particle diameter of the nanocrystalline 122 or the ratio of the nanocrystalline 122 to the amorphous 124 is variable in the thickness direction in the hard coating layer 120. For example, the hard coating layer 120 may be configured to define a low ratio of the nanocrystallines 122 to the amorphous 124, that is, a high ratio of the amorphous 124, close to the inner side of the hard coating layer 120 in contact with the blade substrate 110, and to define a high ratio of the nanocrystallines 122 to the amorphous 124, that is, a high ratio of the nanocrystallines 122, close to the outer side of the hard coating layer 120. The configuration with the composition ratios being variable in the thickness direction in the hard coating layer 120 may be implemented by providing variations in the area ratio of the dissimilar materials in at least one of the single composite targets 20, 21, and 22 in a direction in which the blade substrate 110 is transferred during the physical vapor deposition. Further, in the sequential and continuous deposition process performed on the razor blade substrate 110 with at least one of the single composite targets 20, 21, and 22, variations in the area ratio of the dissimilar materials in the single composite targets 20, 21, 22 cause particles to be drawn out therefrom at various composition ratios such that different composition ratios of the particles are deposited on the razor blade 110 in the early and late deposition stages.

In addition, although the hard coating layer 120 according to at least one embodiment features a single layer deposited in the form of the nanocrystalline 122 of Cr and B crystallographically combined and the amorphous material 124 into which Cr and B are mixed, the present disclosure does not exclude that a buffer layer or adhesion enhancing layer is incorporated between the hard coating layer 120 and the blade substrate 110 or that the Cr coating layer may be laminated as an interlayer between the hard coating layer 120 and the polymer coating 130.

The hard coating layer 120 according to at least one embodiment is a single layer that has expectable improvements in strength and durability, and it may be formed to have dissimilar materials that are gradually changed in their composition ratio in the thickness direction, and in particular, formed to have such advantageous composition ratio in the regions close to both side surfaces of the razor blade 10 such that adhesion with the material or the coating layer that comes into contact with both side surfaces is enhanced.

The present disclosure provides an improvement to the razor blade coating by a physical vapor deposition method, by forming a hard coating layer as a thin coating layer in which chromium boride, which is nanocrystallines having high hardness, is dispersed in an amorphous mixture of chromium and boron, and thereby improving the strength and hardness of the thin coating layer and securing the bonding force by chromium in the amorphous mixture between the hard coating layer and the blade substrate.

Although exemplary embodiments of the present disclosure have been described for illustrative purposes, those skilled in the art will appreciate that various modifications, additions, and substitutions are possible, without departing from the various characteristics of the disclosure. Therefore, exemplary embodiments of the present disclosure have been described for the sake of brevity and clarity. Accordingly, one of ordinary skill would understand the scope of the disclosure is not limited by the above explicitly described embodiments but by the claims and equivalents thereof.

What is claimed is:

1. A razor blade, comprising:
   a blade substrate on which a blade edge is formed;
   a hard coating layer coated on the blade substrate, the hard coating layer including an amorphous region in which chromium and boron are mixed, wherein one or more nanocrystalline structures are dispersed in the amorphous region; and
   a polymer coating formed on the hard coating layer,
   wherein the one or more nanocrystalline structures included in the hard coating layer has a volume ratio of 30% or more.

2. The razor blade of claim 1, wherein the one or more nanocrystalline structures comprise chromium boride.

3. The razor blade of claim 1, wherein the hard coating layer is a single layer.

4. The razor blade of claim 1, wherein the one or more nanocrystalline structures comprise particles with a diameter in a range of 3 to 100 nm.

5. The razor blade of claim 1, wherein the hard coating layer has a thickness in a range of 10 to 1000 nm.

6. The razor blade of claim 1, further comprising an adhesion-enhancing layer disposed between the hard coating layer and the blade substrate.

7. The razor blade of claim 6, wherein an amount of chromium in the adhesion-enhancing layer is at least 90%.

8. The razor blade of claim 1, wherein the hard coating layer is configured to have the one or more nanocrystalline structures at a ratio that varies gradually from an inner side to an outer side of the hard coating layer.

9. A method for manufacturing a razor blade, the method comprising:
   performing a heat treatment on a blade substrate;
   forming a blade edge on the blade substrate by polishing the heat-treated blade substrate;
   forming a hard coating layer by performing physical vapor deposition (PVD) on the heat-treated blade substrate, on which the blade edge is formed, by using a single composite target including chromium and boron that are mechanically combined and mixed to provide the hard coating layer including an amorphous region in which the chromium and the boron are mixed, wherein one or more nanocrystalline structures are dispersed in the amorphous region; and forming a polymer coating on the hard coating layer, wherein the physical vapor deposition is performed for sputtering by a collision cascade process under a sputtering condition that the blade substrate has a bias in a range of −50 to −750 V, a temperature in a range of 0 to 200° C., and a direct current (DC) power density in a range of 1 to 12 W/cm2.

10. The method of claim 9, wherein the hard coating layer is a single layer.

11. The method of claim 9, wherein the one or more nanocrystalline structures comprise particles with a diameter in a range of 3 to 100 nm.

12. The method of claim 9, wherein the physical vapor deposition that forms the hard coating layer is performed for sputtering by a collision cascade process under a sputtering condition that the blade substrate has a bias in a range of −200 to −600 V, a temperature in a range of 100 to 150° C., and a DC power density in a range of 4 to 8 W/cm2.

13. The method of claim 9, wherein the single composite target further includes:
a material in which the chromium and the boron are crystallographically combined.

14. The method of claim 9, wherein the hard coating layer is configured to have the one or more nanocrystalline structures of chromium boride at a volume ratio that is changed in a thickness direction by adjusting an area ratio of the chromium to the boron in the single composite target in a direction in which the blade substrate moves through a deposition with respect to the single composite target.

15. A razor blade comprising:
a blade substrate on which a blade edge is formed;
a hard coating layer coated on the blade substrate, the hard coating layer including an amorphous region in which chromium and boron are mixed, wherein one or more nanocrystalline structures are dispersed in the amorphous region;
a polymer coating formed on the hard coating layer; and
an adhesion-enhancing layer disposed between the hard coating layer and the blade substrate,
wherein an amount of chromium in the adhesion-enhancing layer is at least 90%.

16. A razor blade comprising:
a blade substrate on which a blade edge is formed;
a hard coating layer coated on the blade substrate, the hard coating layer including an amorphous region in which chromium and boron are mixed, wherein one or more nanocrystalline structures are dispersed in the amorphous region; and
a polymer coating formed on the hard coating layer,
wherein the hard coating layer is configured to have the one or more nanocrystalline structures at a ratio that varies gradually from an inner side to an outer side of the hard coating layer.

* * * * *